US008669810B2

United States Patent
Kwon et al.

(10) Patent No.: US 8,669,810 B2
(45) Date of Patent: Mar. 11, 2014

(54) TIME DIFFERENCE AMPLIFIER AND AMPLIFICATION METHOD USING SLEW RATE CONTROL

(75) Inventors: Hye Jung Kwon, Daegu-si (KR); Hong June Park, Pohang-si (KR)

(73) Assignee: Postech Academy-Industry Foundation, Pohang-Si, Gyeongsangbuk-Do (KR)

( * ) Notice: Subject to any disclaimer, the term of this patent is extended or adjusted under 35 U.S.C. 154(b) by 78 days.

(21) Appl. No.: 13/536,925

(22) Filed: Jun. 28, 2012

(65) Prior Publication Data

US 2013/0249627 A1    Sep. 26, 2013

(30) Foreign Application Priority Data

Mar. 23, 2012  (KR) .......................... 10-2012-0029860

(51) Int. Cl.
  *H03F 3/45*    (2006.01)
(52) U.S. Cl.
  USPC ............................................ 330/69; 330/252
(58) Field of Classification Search
  USPC ................. 330/69, 252; 327/170, 108, 112
  See application file for complete search history.

(56) References Cited

U.S. PATENT DOCUMENTS

| 6,466,071 | B2 * | 10/2002 | Kim et al. ..................... 327/175 |
| 7,498,844 | B2 * | 3/2009 | Rho ............................... 326/86 |
| 7,728,641 | B2 * | 6/2010 | Lee ................................ 327/170 |
| 2001/0030562 | A1 * | 10/2001 | Kim et al. ..................... 327/175 |

OTHER PUBLICATIONS

A High-Gain Wide-Input-Range Time Amplifier with an Open-Loop Architecture and a Gain Equal to Current Bias Ratio, by Hye-Jung Kwon et al., IEEE Asian Solid-State Circuits Conference, pp. 325-328, Nov. 14, 2011.

* cited by examiner

*Primary Examiner* — Henry Choe
(74) *Attorney, Agent, or Firm* — Kile Park Reed & Houtteman PLLC

(57) ABSTRACT

When a time difference is amplified by a time difference amplifier, slew rates of internal output voltages are changed according to a phase combination of digital input signals so that a time gain is determined by a ratio between the slew rates and the slew rates can be controlled from an outside. After a voltage is charged to the level of a power supply voltage in first and second charging capacitors, the charged voltage of the first charging capacitor is decreased with a first slew rate when a first digital input signal transitions, and both charged voltages of the first and second charging capacitors are decreased with a second slew rate when a second digital input signal transitions so that both first and second digital input signals are changed from initial phases, while being compared with a reference voltage to generate first and second digital output signals.

11 Claims, 14 Drawing Sheets

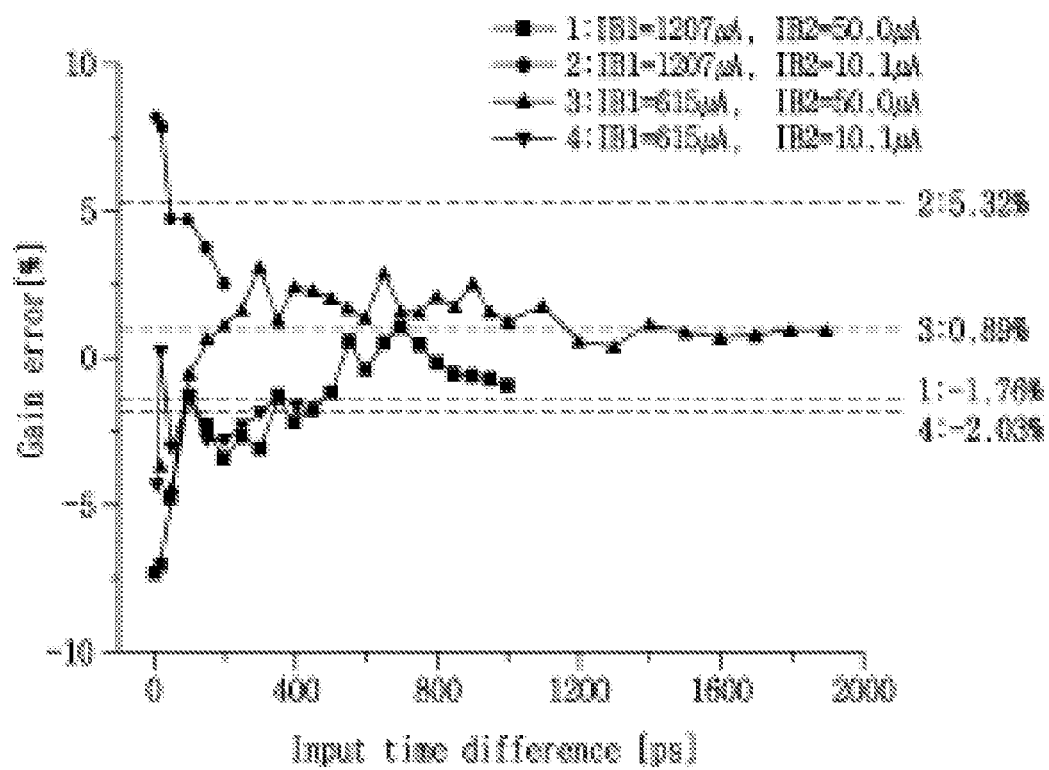

FIG. 12

| Technique | SR latch | Inverter | Switch type (this work) |
|---|---|---|---|
| Gain[s/s] | 25K(fixed) | 2(fixed) | 10-120(variable) |
| Max. input range | ±40ps | ±100ps | ±2000ps |
| Linearity (gain error[%]) | AV:- ptp:4.5 | AV:8 ptp:15 | AV:1.7 ptp:-7.3 (gain=24.1) |

(AV: average, ptp: peak-to-peak)

TIME DIFFERENCE AMPLIFIER AND AMPLIFICATION METHOD USING SLEW RATE CONTROL

BACKGROUND OF THE INVENTION

1. Field of the Invention

The present invention relates to a time difference amplifier, and more particularly, to a time difference amplifier using slew rate control, in which the slew rates of internal output voltages are changed according to a phase combination of digital input signals such that a time gain is determined by a ratio between the slew rates, thereby allowing the slew rates to be regulated from an outside to control the time gain.

2. Description of the Related Art

These days, with the development of semiconductor processing technologies, the operating speed of an analog integrated circuit has been improved, and the power supply voltage of the analog integrated circuit has been decreased. Under these situations, a characteristic that a time resolution is more excellent than a voltage resolution results. Due to this fact, recently, instead of an analog-to-digital converter (ADC) for converting a voltage difference between analog signals into a digital value, a time-to-digital converter (TDC) tends to be used. By not solely using a time-to-digital converter and instead serially connecting a voltage-controlled delay line (VCDL) with a time-to-digital converter, the voltage-controlled delay line can convert a difference between analog voltages into a time difference between the rising edges of two digital signals, and the time-to-digital converter can convert the time difference into a digital value, so that the same effects as in an analog-to-digital converter can be accomplished.

There are various methods for improving the time resolution of a time-to-digital converter. One of these methods is to use a time difference amplifier by connecting it to the front end of a time-to-digital converter.

The time difference amplifier is a circuit which amplifies a time difference between changing edges of two digital input signals at a predetermined rate and increases a time difference between changing edges of two digital output signals. The time gain of the time difference amplifier is defined as a value acquired by dividing a time difference between the changing edges of two digital output signals by a time difference between the changing edges of two digital input signals.

FIG. 1 is a diagram showing the function of a conventional time difference amplifier. Referring to FIG. 1, when assuming that a time difference between the changing edges of first and second digital input signals IN1 and IN2 inputted to a time difference amplifier 110 is $\Delta T_{IN}$ and a time difference between the changing edges of first and second digital output signals OUT1 and OUT2 of the time difference amplifier 110 is $\Delta T_{OUT}$, a time gain G of the time difference amplifier 110 is $\Delta T_{OUT}/\Delta T_{IN}$.

As described above, a time difference amplifier is used by being serially connected with a time-to-digital converter, and FIG. 2 shows an example. Referring to FIG. 2, the two output terminals of a time difference amplifier 210 are serially connected to the two input terminals of a time-to-digital converter 220. In this case, since a time difference between the changing edges of two digital signals inputted to the time-to-digital converter 220 are amplified by the time difference amplifier 210, the time resolution of the time-to-digital converter 210 is resultantly improved.

FIG. 3 is a diagram showing a principle that a time resolution is improved in the conventional time difference amplifier. Referring to FIG. 3, when a time difference amplifier with a time gain of G and a time-to-digital converter with a time resolution of Td are connected in series as shown in FIG. 2, a final time resolution becomes Td/G. In this case, a time resolution is improved further while a circuit size and power consumption are significantly decreased, when compared to a method for improving a time resolution of a conventional time-to-digital converter which uses Vernier delay lines where a time delay difference between two delay lines corresponds to a time resolution of the time-to-digital converter.

In order for a time difference amplifier to be effectively used in various application fields, some conditions should be satisfied. Typical conditions include a large gain, a wide input range and linearity.

That is to say, for a time period with a wide time difference between the changing edges of two digital input signals inputted to a time difference amplifier, it is necessary to satisfy conditions that a time difference between the changing edges of two digital output signals is maintained at a constant rate with respect to a time difference between the changing edges of the two digital input signals and the rate has a large value.

The reason to this resides in that, since a time difference amplifier is used by being coupled mainly with a time-to-digital converter as described above, a number of time difference amplifiers should be connected in series when a time gain is small, to obtain a desired time gain and a desired time resolution. Another reason resides in that, in the case where a time difference amplifier operates only in a period with a narrow time difference between the changing edges of input signals, the operating range of the time-to-digital converter is limited. Still another reason resides in that, in the case where a time gain of a time difference amplifier is not constant with respect to the time difference between the changing edges of the input signals, the time difference amplifier cannot be used in an application where a precise time period is to be measured.

FIG. 4 is a circuit diagram of a conventional time difference amplifier. Referring to FIG. 4, a conventional time difference amplifier 400 has a positive feedback loop structure. Here, the time difference amplifier 400 is a time difference amplifier which uses the metastable phase of SR latches 410 and 420. In other words, the time difference amplifier 400 is a time difference amplifier which uses a phenomenon that a time required for phase change of two output signals is lengthened as a time difference between the changing edges of two digital input signals is shortened. The time difference amplifying function of the time difference amplifier 400 is performed only when the time difference between the changing edges of two input signals falls in a period with a metastable phase. Moreover, in the time difference amplifier 400, since the value of a time gain is not constant with respect to the time difference between the changing edges of the input signals, the time difference amplifier 400 may be used only during a substantially narrow time period (of ±40 ps). Furthermore, a time gain is limited to 20 at the maximum.

FIG. 5 is a circuit diagram of another conventional time difference amplifier. A time difference amplifier 500 shown in FIG. 5 also has a positive feedback loop structure and includes an SR latch 510 based on NAND gates ND1 and ND2. The time difference amplifier 500 is a time difference amplifier which operates according to a principle that discharge degrees by pull-down circuits of the two NAND gates ND1 and ND2 symmetrically disposed are determined by outputs of opposite-side NAND gates ND1 and ND2 so that the output of one NAND gate of which input phase is changed earlier is changed quickly and the output of the other NAND gate of which input phase is changed later is changed slowly.

The time difference amplifying function of the time difference amplifier 500 is performed only during a narrow input time period such that it is possible to control influence of the respective outputs of the two NAND gates ND1 and ND2 over operations of opposite-side NAND gates ND1 and ND2. Since the time difference amplifier 500 has the positive feedback loop structure, the value of a time gain is not constant with respect to a time difference between the changing edges of input signals, and thus, in order to correct this, a correction unit 520 based on a voltage-controlled delay line (VCDL) is needed. The time gain of the time difference amplifier 500 is locked to 2, and a maximum input time period is about ±100 ps in the case of using the correction unit 520. In order to increase a time gain, a cascade structure in which a number of time difference amplifiers are consecutively connected should be used.

As a consequence, in the conventional time difference amplifier, the value of a time gain is not constant with respect to a time difference between the changing edges of input signals due to the positive feedback loop structure, and thus, problems are caused in that the time difference amplifier may be used only in a very narrow time period and a time gain is small.

Also, in the conventional time difference amplifier, since the cascade structure in which a number of time difference amplifiers are consecutively connected should be used in order to increase a time gain, a large space and a lot of costs are needed.

SUMMARY OF THE INVENTION

Accordingly, the present invention has been made in an effort to solve the problems occurring in the related art, and an object of the present invention is to provide a time difference amplifier which adopts an open loop slew rate control scheme, thereby obtaining a constant time gain for a wide input time period and allowing a time gain to be controlled from an outside from a low value time gain to a high value time gain.

In order to achieve the above object, according to one aspect of the present invention, there is provided a time difference amplifier using slew rate control, including: a first digital signal output unit including a first slew rate setting section configured to set a first slew rate for a voltage charged to a level of a power supply voltage in a first charging capacitor and generate a first output voltage which is decreased with the first slew rate when a first digital input signal inputted to a first input terminal transitions and to change the first slew rate to a second slew rate and generate the first output voltage which is decreased with the second slew rate when a second digital input signal inputted to a second input terminal transitions so that phases of the first digital input signal and the second digital input signal become different from initial phases, and a first voltage comparator configured to compare the first output voltage outputted from the first slew rate setting section with a reference voltage and accordingly output a first digital signal; and a second digital signal output unit including a second slew rate setting section configured to output a voltage of the level of the power supply voltage charged in a second charging capacitor as a second output voltage when the second digital input signal inputted to a third input terminal does not transition and to set the second slew rate for the voltage charged to the level of the power supply voltage and generate the second output voltage which is decreased with the second slew rate when the second digital input signal inputted to the third input terminal transitions so that the phases of the first digital input signal and the second digital input signal become different from the initial phases, and a second voltage comparator configured to compare the second output voltage outputted from the second slew rate setting section with the reference voltage and accordingly output a second digital signal.

According to another aspect of the present invention, there is provided a time difference amplifier using slew rate control, including: a first digital signal output unit including a first slew rate setting section configured to set a first slew rate for a voltage discharged to a level of a ground voltage in a first charging capacitor and generate a first output voltage which is increased with the first slew rate when a first digital input signal inputted to a first input terminal transitions and to change the first slew rate to a second slew rate and generate the first output voltage which is increased with the second slew rate when a second digital input signal inputted to a second input terminal transitions so that phases of the first digital input signal and the second digital input signal become different from initial phases, and a first voltage comparator configured to compare the first output voltage outputted from the first slew rate setting section with a reference voltage and accordingly output a first digital signal; and a second digital signal output unit including a second slew rate setting section configured to output a voltage of the level of the ground voltage discharged in a second charging capacitor as a second output voltage when the second digital input signal inputted to a third input terminal does not transition and to set the second slew rate for the voltage discharged to the level of the ground voltage and generate the second output voltage which is increased with the second slew rate when the second digital input signal inputted to the third input terminal transitions so that the phases of the first digital input signal and the second digital input signal become different from the initial phases, and a second voltage comparator configured to compare the second output voltage outputted from the second slew rate setting section with the reference voltage and accordingly output a second digital signal.

According to still another aspect of the present invention, there is provided a time difference amplification method using slew rate control, including: (a) setting a first slew rate for a voltage charged to a level of a power supply voltage in a first charging capacitor and generating a first output voltage which is changed with the first slew rate when a first digital input signal inputted to a first input terminal of a first slew rate setting section transitions, and changing the first slew rate to a second slew rate and generating the first output voltage which is changed with the second slew rate when a second digital input signal inputted to a second input terminal of the first slew rate setting section transitions so that phases of the first digital input signal and the second digital input signal become different from initial phases; (b) comparing the first output voltage with a reference voltage and outputting a first digital signal by a first voltage comparator; (c) outputting a voltage of the level of the power supply voltage charged or a ground voltage discharged in a second charging capacitor as a second output voltage when the second digital input signal inputted to a third input terminal of a second slew rate setting section does not transition, and setting the second slew rate for the voltage charged to the level of the power supply voltage or discharged to the level of the ground voltage and generating the second output voltage which is decreased with the second slew rate when the second digital input signal inputted to the third input terminal of the second slew rate setting section transitions so that the phases of the first digital input signal and the second digital input signal become different from the initial phases; and (d) comparing the second output voltage outputted from the second slew rate setting section with the reference voltage and outputting a second digital signal by a second voltage comparator.

BRIEF DESCRIPTION OF THE DRAWINGS

The above objects, and other features and advantages of the present invention will become more apparent after a reading of the following detailed description taken in conjunction with the drawings, in which:

FIG. 11 is a graph showing average errors and peak-to-peak errors of HSPICE simulation results for time gain calculation results in the present invention; and FIG. 12 is a table comparing performances of the time difference amplifier according to the present invention and the conventional time difference amplifier.

DETAILED DESCRIPTION OF PREFERRED EMBODIMENTS

Figure 1:
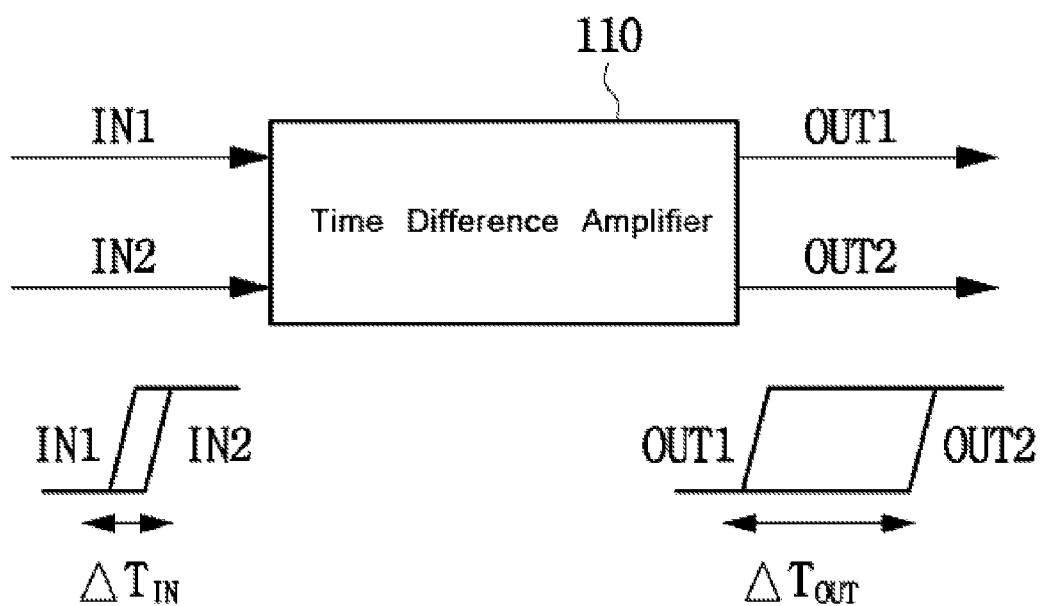
FIG. 1 is a diagram showing the function of a conventional time difference amplifier.
Figure 2:
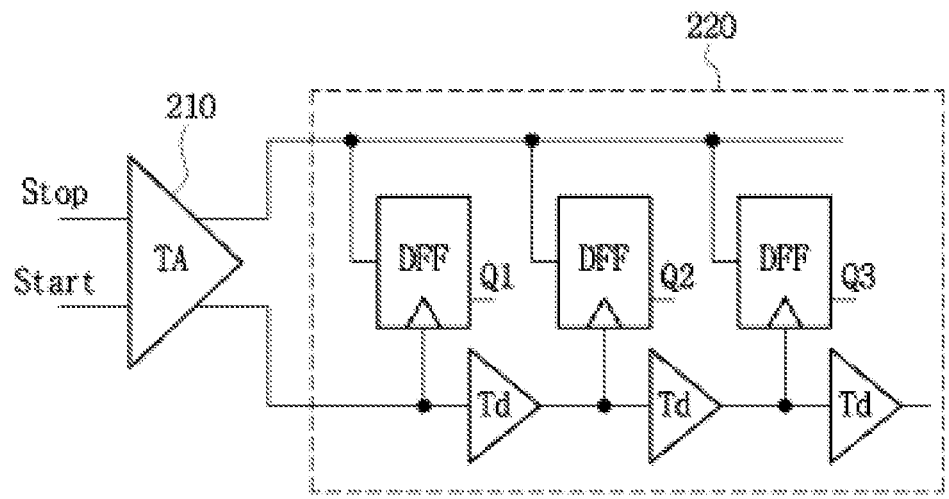
FIG. 2 is a diagram showing a structure in which a time difference amplifier is connected in series with a time-to-digital converter.
Figure 3:
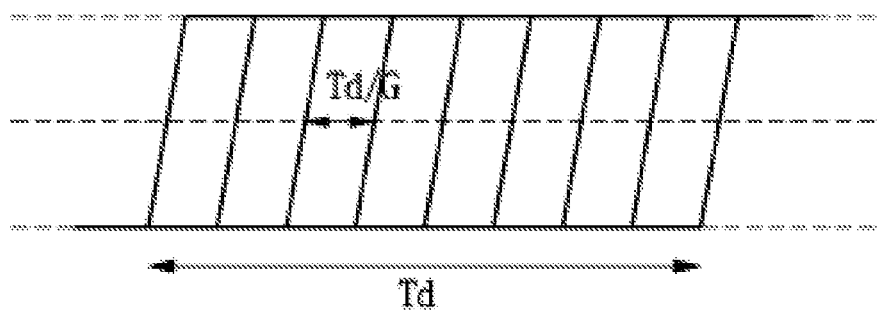
FIG. 3 is a diagram showing a principle that a time resolution is improved in the conventional time difference amplifier.
Figure 4:
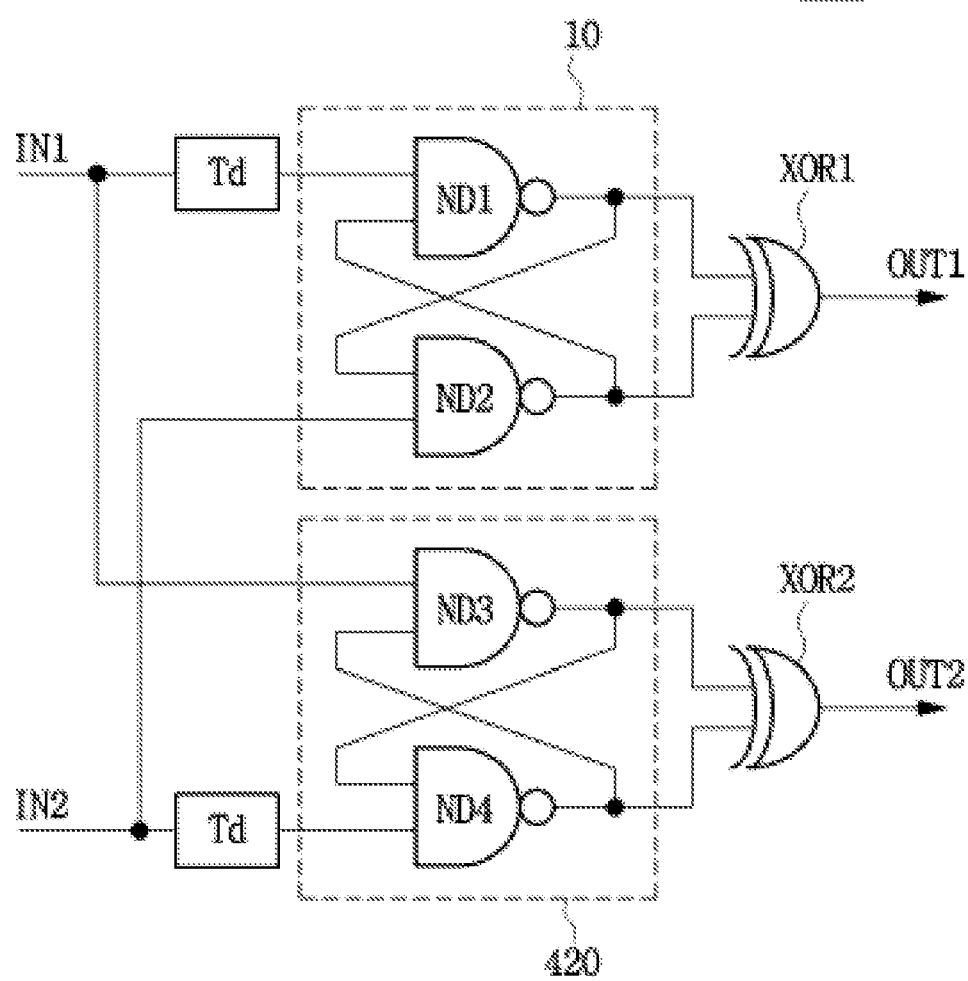
FIG. 4 is a circuit diagram of a conventional time difference amplifier.
Figure 5:
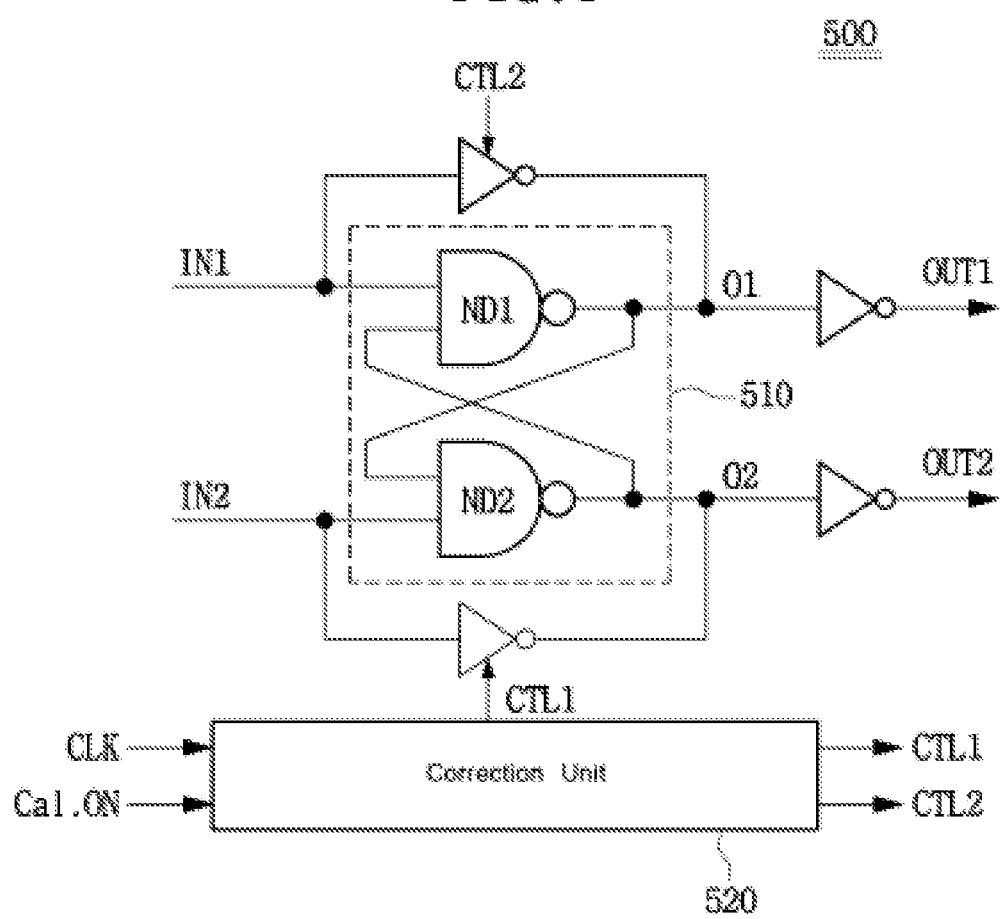
FIG. 5 is a circuit diagram of another conventional time difference amplifier.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 6:
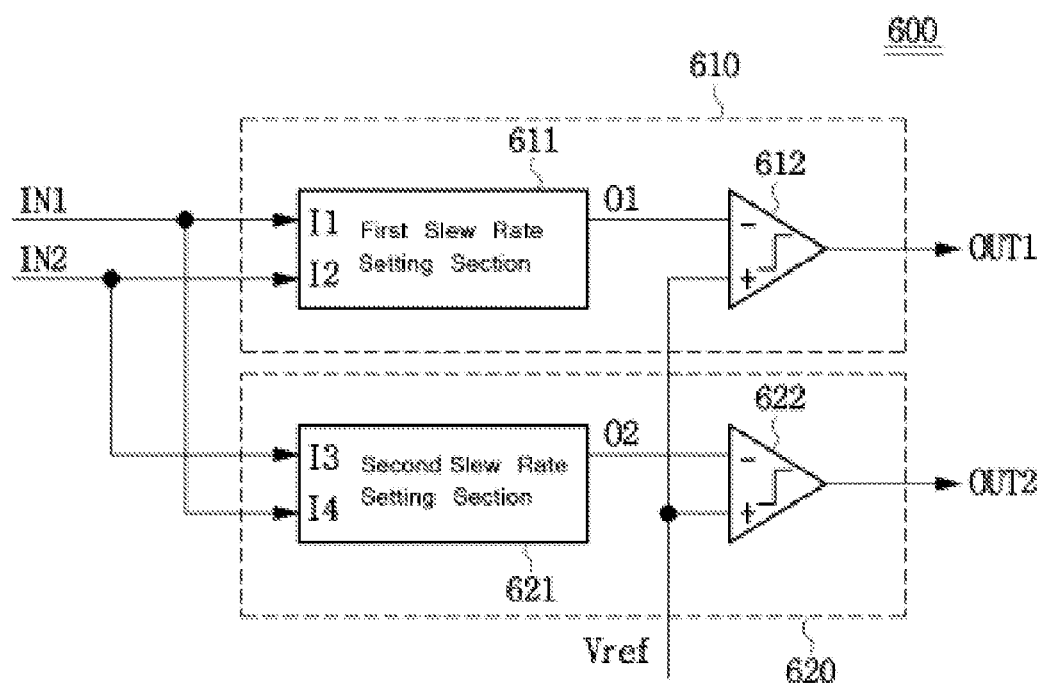
FIG. 6 is a block diagram showing a time difference amplifier using slew rate control in accordance with an embodiment of the present invention.

FIG. 6 is a block diagram showing a time difference amplifier using slew rate control in accordance with an embodiment of the present invention. Referring to FIG. 6, a time difference amplifier 600 includes a first digital signal output unit 610 and a second digital signal output unit 620. The first digital signal output unit 610 includes a first slew rate setting section 611 and a first voltage comparator 612, and the second digital signal output unit 620 includes a second slew rate setting section 621 and a second voltage comparator 622.

A first digital input signal IN1 is commonly inputted to a first input terminal 11 of the first slew rate setting section 611 and a fourth input terminal 14 of the second slew rate setting section 621. A second digital input signal IN2 is commonly inputted to a second input terminal 12 of the first slew rate setting section 611 and a third input terminal 13 of the second slew rate setting section 621. The inverting input terminal of the first voltage comparator 612 is connected to the output terminal of the first slew rate setting section 611, and the non-inverting terminal of the first voltage comparator 612 is connected to the terminal of a reference voltage Vref. The inverting input terminal of the second voltage comparator 622 is connected to the output terminal of the second slew rate setting section 621, and the non-inverting terminal of the second voltage comparator 622 is connected to the terminal of the reference voltage Vref.

The first slew rate setting section 611 is configured to set a slew rate according to a phase combination of the first and second digital input signals IN1 and IN2 respectively inputted to the first and second input terminals 11 and 12 thereof and accordingly generate a first output voltage O1. The first voltage comparator 612 is configured to compare the first output voltage O1 of the first slew rate setting section 611 with the reference voltage Vref and accordingly generate a first digital output signal OUT1.

The second slew rate setting section 621 is configured to set a slew rate according to a phase combination of the second and first digital input signals IN2 and IN1 respectively inputted to the third and fourth input terminals 13 and 14 thereof and accordingly generate a second output voltage O2. The second voltage comparator 622 is configured to compare the second output voltage O2 of the second slew rate setting section 621 with the reference voltage Vref and accordingly generate a second digital output signal OUT2.

From these facts, it can be seen that the time difference amplifier 600 has an open loop structure in which the first and second digital output signals OUT1 and OUT2 are determined only by the first and second digital input signals IN1 and IN2 and feedback is not employed.

Figure 7:
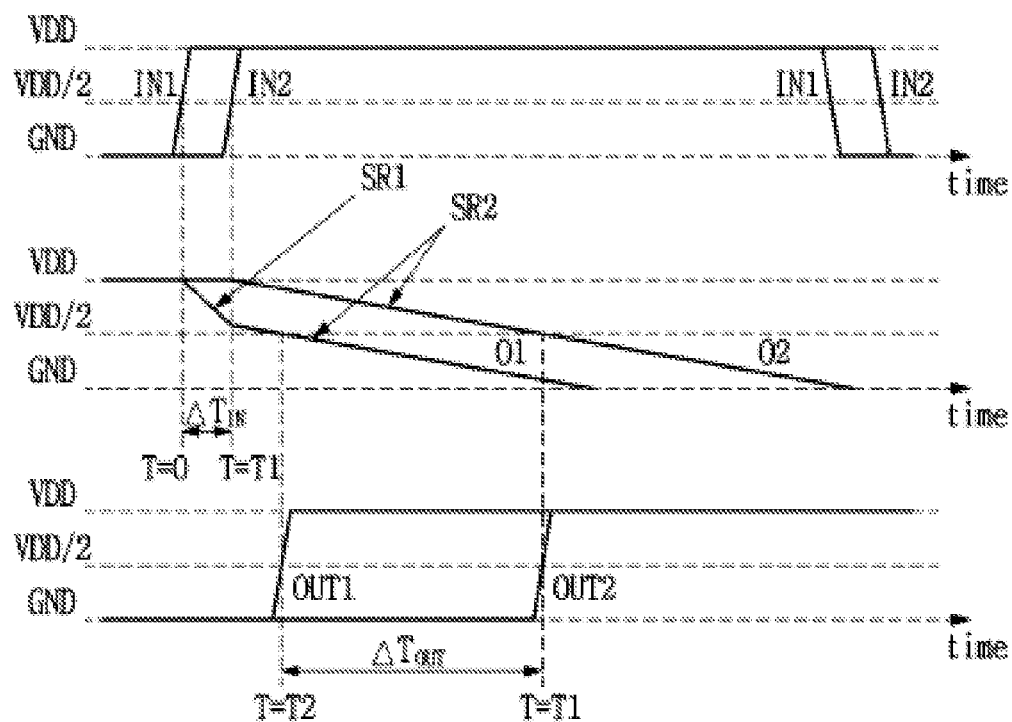
FIG. 7 is a timing diagram showing digital input signals, two output voltages and digital output signals in FIG. 6.

FIG. 7 is a timing diagram showing the first and second digital input signals IN1 and IN2, the first and second output voltages O1 and O2, and the first and second digital output signals OUT1 and OUT2. The operating principle of the time difference amplifier 600 will be described below in detail with reference to FIG. 7.

In an initial time period (T=0) in which the first and second digital input signals IN1 and IN2 are '00', the first and second slew rate setting sections 611 and 621 output a power supply voltage (for example, VDD) as the first and second output voltages O1 and O2 as it is.

Then, in a time period (for example, 0<T<T1) in which one of the first and second digital input signals IN1 and IN2 transitions (for example, to be '10'), since the first slew rate setting section 611 is inputted with the changed first digital input signal IN1 through the first input terminal 11, the first slew rate setting section 611 sets a first slew rate SR1 for the power supply voltage VDD and accordingly, generates the first output voltage O1. At this time, since the second slew rate setting section 621 is continuously inputted with the unchanged second digital input signal IN2 through the third input terminal 13, the second slew rate setting section 621 continuously outputs the power supply voltage VDD as the second output voltage O2 as it is.

Thereafter, in a time period (for example, T1<T) in which the second digital input signals IN2 transitions so that both the first and second digital input signals IN1 and IN2 transition (for example, to be '11'), the first slew rate setting section 611 changes the first slew rate SR1 previously applied to the power supply voltage VDD into a second slew rate SR2 and accordingly, generates the first output voltage O1. The second slew rate setting section 621 sets the second slew rate SR2 for the power supply voltage VDD and accordingly, generates the second output voltage O2. Therefore, the first and second output voltages O1 and O2 of the first and second slew rate setting sections 611 and 621 are decreased with the same slew rate SR2 while having a voltage level difference according to the first slew rate SR1, as shown in FIG. 7.

The first voltage comparator 612 compares the first output voltage O1 of the first slew rate setting section 611 which is decreased in this way, with the reference voltage Vref, and transitions the first digital output signal OUT1 from the level of a ground voltage (for example, VSS) to the level of the power supply voltage (for example, VDD) when the first output voltage O1 drops below the level of the reference voltage Vref (for example, T=T2). The second voltage comparator 622 compares the second output voltage O2 of the second slew rate setting section 621 which is decreased in this way, with the reference voltage Vref, and transitions the second digital output signal OUT2 from the level of the ground voltage to the level of the power supply voltage (VDD) when the second output voltage O2 drops below the level of the reference voltage Vref (for example, T=T3).

In the case where the first slew rate SR1 applied to the time period as described above is larger than the second slew rate SR2 applied to the time period as described above, a time period ΔTout in which the first and second output voltages O1 and O2 reach the reference voltage Vref becomes longer at a predetermined ratio than a time difference ΔTin between the changing edges of the first and second digital input signals IN1 and IN2.

The reason to this resides in that, because the second output voltage O2 continuously maintains the power supply voltage VDD while the first output voltage O1 is decreased with the first slew rate SR1 in the time period 0<T<T1 and both the first and second output voltages O1 and O2 are decreased with the second slew rate SR2 in the time period T1<T, a difference is caused between the first and second output voltages O1 and O2 in correspondence to the first slew rate SR1 and the time T1.

At the time (T=T1) where both the first and second digital input signals IN1 and IN2 transition from the initial phases of '00' to '11', first and second output voltages V(O1) and V(O2) are expressed as in the following Mathematical Expression 1.

$$V(O1)=VDD-SR1 \times t1$$

$$V(O2)=VDD \quad \text{[Mathematical Expression 1]}$$

When changing both the first and second output voltages O1 and O2 with the second slew rate SR2 at the time T=T1 where both the first and second digital input signals IN1 and IN2 transition to '11', the first output voltage O1 is in a state in which it has been already changed with the first slew rate SR1 and is lower than the second output voltage O2. Thus, times required for the first and second output voltages O1 and O2 to reach the reference voltage Vref become different from each other, and may be easily calculated as in the following Mathematical Expressions 2 and 3.

$$t2 = t1 \times \left(1 - \frac{SR1}{SR2}\right) + \frac{(VDD - Vref)}{SR2} \quad \text{[Mathematical Expression 2]}$$

$$t3 = t1 + \frac{(VDD - Vref)}{SR2} \quad \text{[Mathematical Expression 3]}$$

A time gain G (=ΔTout/ΔTin)) of the time difference amplifier 600 may be expressed as in the following Mathematical Expression 4 using the Mathematical Expressions 2 and 3.

$$G = \frac{t3 - t2}{t1} = \frac{SR1}{SR2} \quad \text{[Mathematical Expression 4]}$$

Namely, the time gain G of the time difference amplifier 600 is determined by dividing the first slew rate SR1 applied to the first slew rate setting section 611 in the time period (for example, 0<T<T1) in which one of the first and second digital input signals IN1 and IN2 transitions (for example, to be '10') by the second slew rate SR2 applied to the first and second slew rate setting sections 611 and 621 in the time period (for example, T1<T) in which both the first and second digital input signals IN1 and IN2 transition (for example, to be '11').

In the present embodiment, due to the fact that the first and second slew rates SR1 and SR2 applied to the first and second slew rate setting sections 611 and 621 may be regulated from an outside of the time difference amplifier 600, the time gain G of the time difference amplifier 600 may be controlled from the outside.

In the time period 0<t<t1 in which the first and second digital input signals IN1 and IN2 are '10', a variation of the output voltage, for example, a variation $(VDD-V(01)|_{t=t1})$ of the first output voltage O1 should be smaller than a difference between the initial value (for example, VDD) and the reference voltage Vref.

Under this condition, a maximum input time range ΔTin.max of the time difference amplifier 600 is expressed as in the following Mathematical Expression 5.

$$\Delta Tin.\max \leq \frac{(VDD - Vref)}{SR1} \quad \text{[Mathematical Expression 5]}$$

Figure 8:
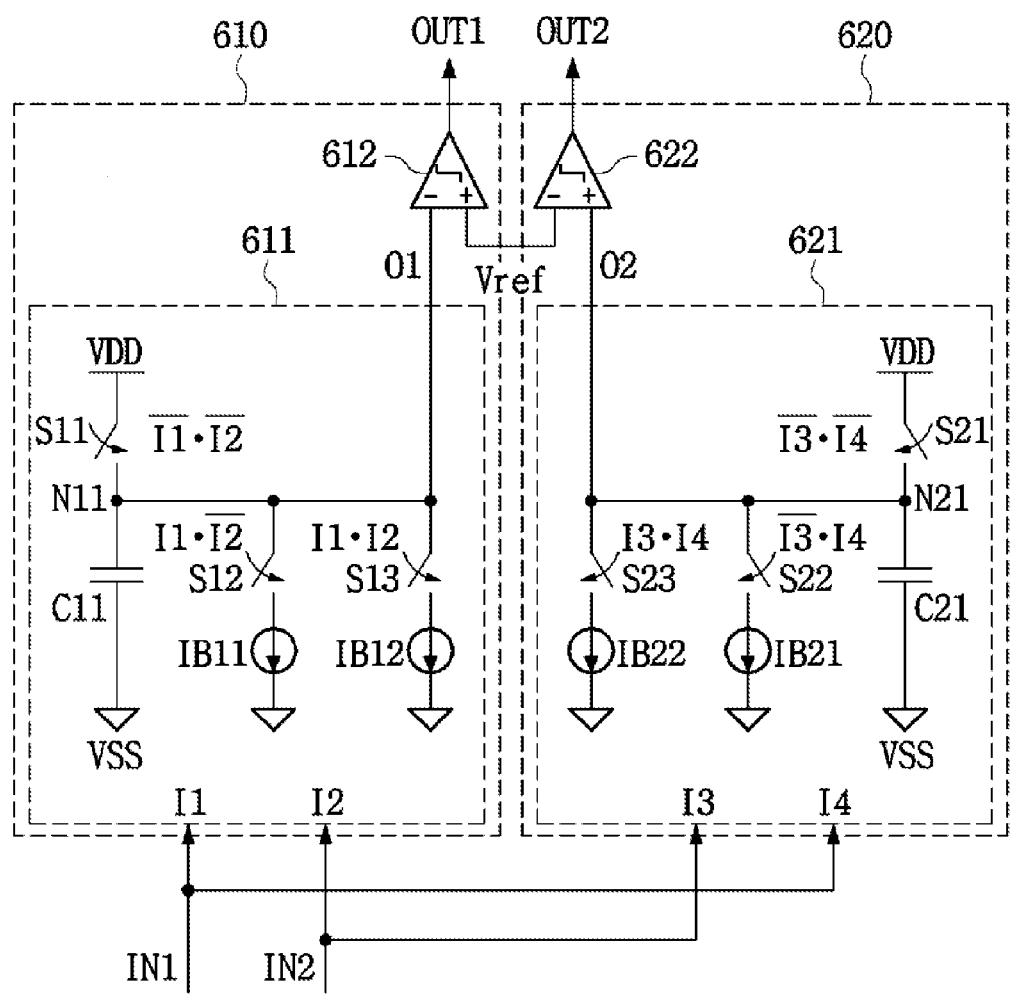
FIG. 8 is a detailed circuit diagram of the time difference amplifier in accordance with the embodiment of the present invention.

FIG. 8 is a detailed circuit diagram of the time difference amplifier in accordance with the embodiment of the present invention. Referring to FIG. 8, the time difference amplifier includes the first slew rate setting section 611 having a first charging switch S11 and a first charging capacitor C11 which are connected in series between a power supply terminal VDD and a ground terminal VSS, and a pair of a first discharging switch S12 and a first current source IB11 and a pair of a second discharging switch S13 and a second current source IB12 each pair of which is connected in series between a first node N11 as a common connection point of the first charging switch S11 and the first charging capacitor C11 connected in series and the ground terminal VSS, the first node N11 being connected to the inverting input terminal of the first voltage comparator 612; and the second slew rate setting section 621 having a second charging switch S21 and a second charging capacitor C21 which are connected in series between the power supply terminal VDD and the ground terminal VSS, and a pair of a third discharging switch S22 and a third current source IB21 and a pair of a fourth discharging switch S23 and a fourth current source IB22 each pair of which is connected in series between a second node N21 as a common connection point of the second charging switch S21 and the second charging capacitor C21 connected in series and the ground terminal VSS, the second node N21 being connected to the inverting input terminal of the second voltage comparator 622.

Although the configurations of the first slew rate setting section 611 and the second slew rate setting section 621 are the same with each other, since the first discharging switch S12 of the first slew rate setting section 611 and the third discharging switch S22 of the second slew rate setting section 621 are switched by different switching control logics, the first and second output voltages O1 and O2 are differently outputted.

In the first slew rate setting section 611, in the initial time period (T=0) in which the first and second digital input signals IN1 and IN2 are '00', the first charging switch S11 is turned on by a turn-on control signal determined by '00'. Accordingly, the power supply voltage VDD is charged in the first charging capacitor C11 through the first charging switch S11 as an initial value.

Similarly, in the second slew rate setting section 621, in the initial time period (T=0) in which the first and second digital input signals IN1 and IN2 are '00', the second charging switch S21 is turned on by the turn-on control signal determined by '00'. Accordingly, the power supply voltage VDD is charged in the second charging capacitor C21 through the first charging switch S21 as an initial value.

Thereafter, in the time period (for example, 0<T<T1) in which one of the first and second digital input signals IN1 and IN2 transitions (for example, to be '10'), both the first charging switch S11 of the first slew rate setting section 611 and the second charging switch S21 of the second slew rate setting section 621 are turned off by a turn-off control signal determined by '10'.

The first discharging switch S12 is turned on by a turn-on control signal which is generated as the digital input signal supplied to the first input terminal 11 of the first slew rate setting section 611 transitions from '0' to '1'. According to this fact, the first node N11 as the common connection point of the first charging switch S11 and the first charging capacitor C11 is connected to the first current source IB11 through the first discharging switch S12. Thus, the initial charging voltage VDD charged in the first charging capacitor C11 starts to be decreased with the first slew rate SR1.

However, the digital input signal is continuously inputted as '0' to the third input terminal 13 of the second slew rate setting section 621. Accordingly, a turn-on control signal based on the transition of the digital input signal from '0' to '1' is not generated. Due to this fact, the third discharging switch S22 of the second slew rate setting section 621 is continuously maintained at a turned-off state. Thus, the second charging capacitor C21 continuously maintains the initial charging voltage VDD.

Afterwards, in the time period (for example, T1<T) in which both the first and second digital input signals IN1 and IN2 transition (for example, to be '11'), the first discharging switch S12 is turned off by a turn-off control signal generated by '11'. However, both the second discharging switch S13 of the first slew rate setting section 611 and the fourth discharging switch S23 of the second slew rate setting section 621 are turned on by a turn-on control signal which is generated based on the transition of both the first and second digital input signals IN1 and IN2 to '11'.

Due to this fact, the charging voltage which is discharged to a level lower than the initial charging voltage VDD from the first charging capacitor C11 of the first slew rate setting section 611 starts to be decreased toward the reference voltage Vref with the second slew rate SR2.

Conversely, since the initial charging voltage VDD is maintained in the second charging capacitor C21 of the second slew rate setting section 621, the charging voltage VDD starts to be decreased toward the reference voltage Vref with the second slew rate SR2.

As a consequence, when the reference voltage Vref is VDD/2, the Mathematical Expressions 2 to 5 may be expressed as in the following Mathematical Expressions 6 to 9. At this time, it is assumed that the first and second charging capacitors C11 and C12 have the same capacitance, the first and third current sources IB11 and IB21 have the same current value and the second and fourth current sources IB12 and IB22 have the same current value.

$$t2 = t1 \times \left(1 - \frac{SR1}{SR2}\right) + \frac{VDD}{2 \times SR2} \quad \text{[Mathematical Expression 6]}$$

$$t3 = t1 + \frac{VDD}{2 \times SR2} \quad \text{[Mathematical Expression 7]}$$

$$G = \frac{t3 - t2}{t1} = \frac{IB11}{IB12} \quad \text{[Mathematical Expression 8]}$$

$$\Delta Tin.\max \leq \frac{C \times VDD}{2 \times IB11} \quad \text{[Mathematical Expression 9]}$$

The Mathematical Expression 9 is exemplified as being applied to the first slew rate setting section 611, and C means the first charging capacitor C11. The Mathematical Expression 9 is applied to the second slew rate setting section 621 in the same manner.

It can be seen from the Mathematical Expressions 6 to 9 that the time gain of the time difference amplifier 600 is determined by the ratio between the current values of the current sources IB11 and IB12 and the ratio between the current values of the current sources IB21 and IB22.

In the case where the current values of the current sources IB11, IB12, IB21 and IB22 may be controlled from an outside of the time difference amplifier 600, the time gain of the time difference amplifier 600 may be controlled from the outside of the time difference amplifier 600.

In the case of the conventional time difference amplifier with the positive feedback loop structure, because the value of a time gain is determined according to the size of transistors which are used when realizing the time difference amplifier, it is difficult to change the time gain after the time difference amplifier is fabricated. Conversely, in the case of the time difference amplifier 600 according to the embodiment of the present invention, because the current values of the first and third current sources IB11 and IB21 and the second and fourth current sources IB12 and IB22 may be controlled from the outside as described above, the time gain may be conveniently changed according to various purposes and applications after the time difference amplifier 600 is fabricated.

Figure 9:
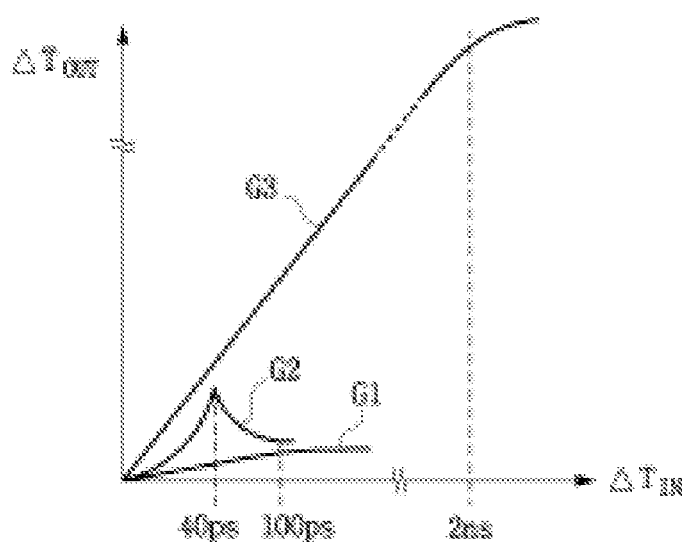
FIG. 9 is a graph showing characteristics of the conventional time difference amplifier and the time difference amplifier according to the present invention.
Figure 10A:
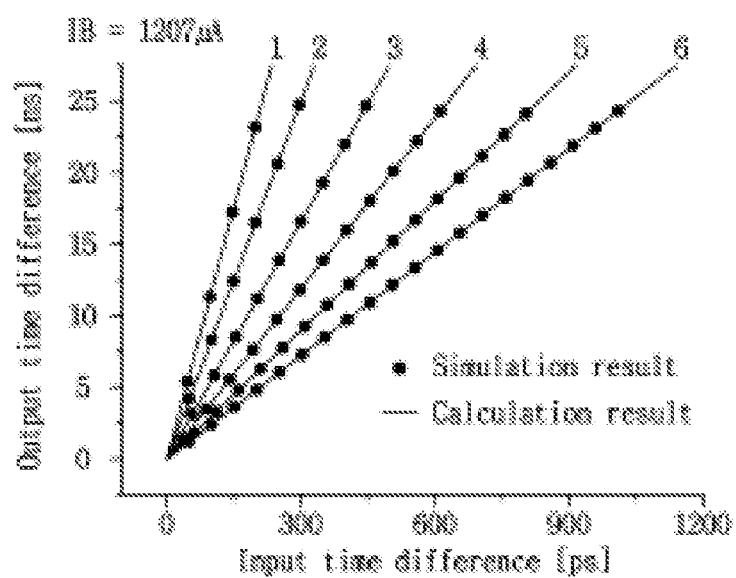
FIGS. 10a to 10d are graphs showing time differences between changing edges of digital output signals in the time difference amplifier according to the present invention.
Figure 10B:
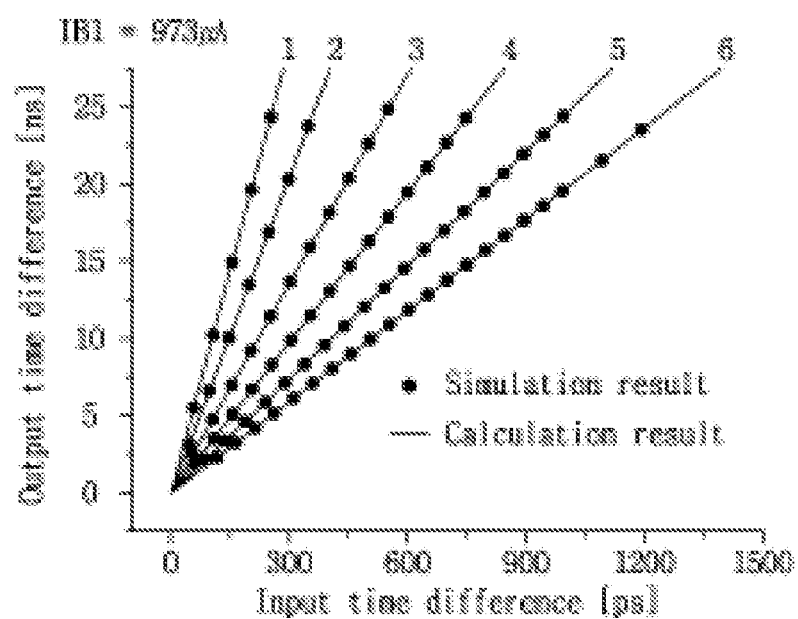
Figure 10C:
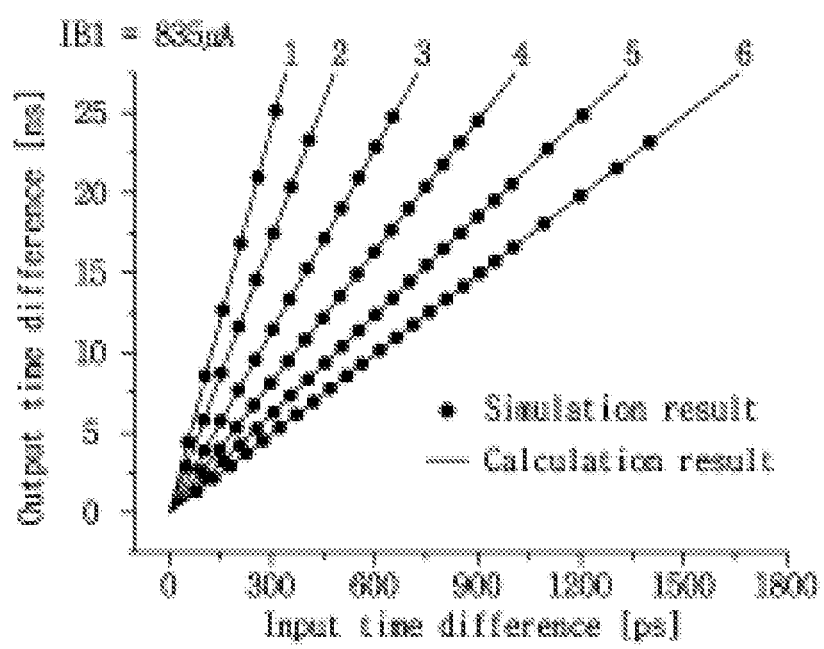
Figure 10D:
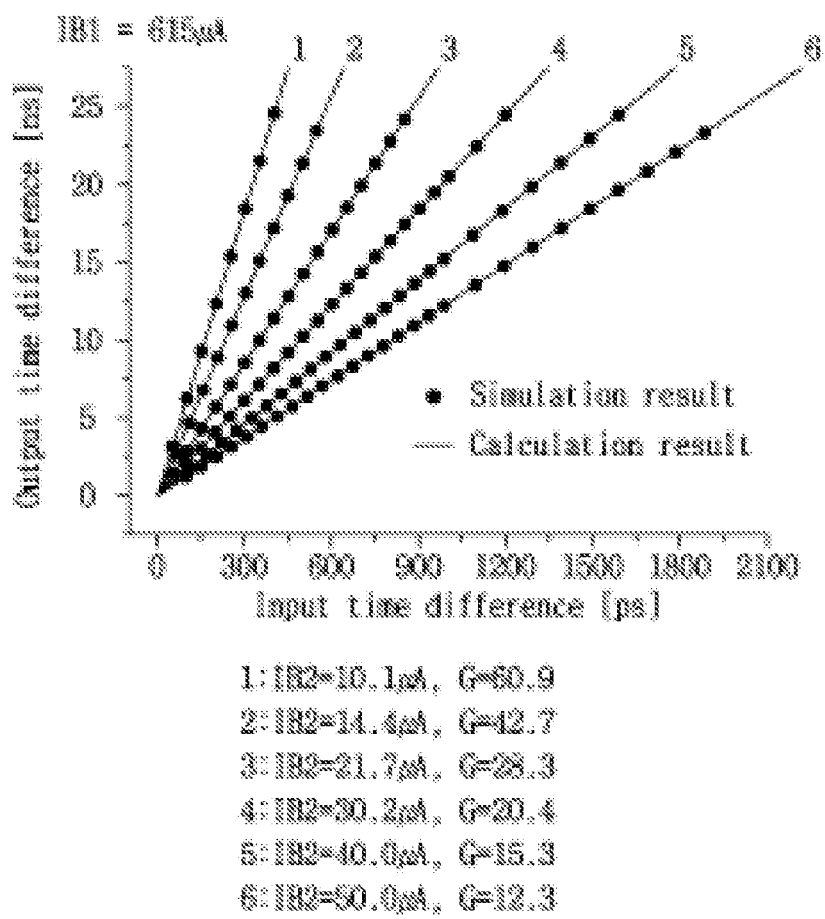

In FIG. 9, G1 is a characteristic curve of the conventional time difference amplifier based on SR latches, and G2 is a characteristic curve of the conventional time difference amplifier based on NAND gates. Further, in FIG. 9, G3 is a characteristic curve of the time difference amplifier according to the embodiment of the present invention. In the conventional time difference amplifier based on SR latches, a maximum input time period is ±40 ps, and a maximum time gain is nothing but 20. Further, in the case of the conventional time difference amplifier based on NAND gates, while it may be used in a maximum input time period of ±100 ps when using a correction circuit, a time gain is locked to 2.

Conversely, in the case of the time difference amplifier according to the embodiment of the present invention, a maximum input time period and a maximum time gain may be obtained from the values of the first and second charging capacitors C11 and C21, the first and third current sources IB11 and IB21 and the second and fourth current sources IB12 and IB22 according to the Mathematical Expressions 8 and 9 given above. When the capacitances of the first and second charging capacitors C11 and C21 are 2 pF, the current values of the first and third current sources IB11 and IB21 may be changed from 0.6 mA up to 1.2 mA and the current values of the second and fourth current sources IB21 and IB22 may be changed from 10 μA to 50 μA, a maximum input time period is ±2000 ps, and a time gain may be changed from 12 up to 120.

FIGS. 10a to 10d are graphs showing time differences between the changing edges of the first and second digital output signals OUT1 and OUT2 with respect to the time differences between the changing edges of the first and second digital input signals IN1 and IN2 when the capacitances of the first and second charging capacitors C11 and C21 are set to 2 pF, the current values of the first and third current sources IB11 and IB21 may be changed from 0.6 mA up to 1.2 mA and the current values of the second and fourth current sources IB21 and IB22 may be changed from 10 μA to 50 μA in the time difference amplifier 600 according to the embodiment of the present invention. The symbols 1 to 6 represent HSPICE simulation results, and the dotted lines (simulation result) represent the calculation values obtained from the Mathematical Expression 8. It can be seen that the results calculated from the Mathematical Expression 8 and the simulation results are similar in all graphs.

FIG. 11 is a graph showing average errors and peak-to-peak errors of the HSPICE simulation results with respect to the time gain calculation results obtained from the Mathematical Expression 8. The symbols 1 to 4 represent error rates of the HSPICE simulation results with respect to the time gain calculation results according to IB1 and IB2 current sources, and the dotted lines represent average errors.

It can be seen that, in four combinations of the first and third current sources IB11 and IB21 and the second and fourth current sources IB12 and Ib22 (1: IB1=1207 μA and IB2=50.0 μA, 2: IB1=1207 μA and IB2=10.1 μA, 3: IB1=615 μA and IB2=50.0 μA, and 4: IB1=615 μA and IB2=10.1 μA), an average error range is −2.03% to 5.32%, and a peak-to-peak error range is −7.3% to 8.2%.

The table of FIG. 12 compares the performances of the time difference amplifier according to the embodiment of the present invention and the conventional time difference amplifier. It can be seen that the time difference amplifier according to the embodiment of the present invention exhibits excellent performance when compared to the peak-to-peak error rate of 4.5% in the conventional time difference amplifier based on SR latches and the peak-to-peak error rate of 15% in the conventional time difference amplifier based on NAND gates.

While it was described above that, after the a voltage is charged in the first and second charging capacitors C11 and C21 to the level of the power supply voltage VDD in an initial state, the charged voltage of the first charging capacitor C11 is decreased with the first slew rate SR1, and then both the charged voltages of the first and second charging capacitors C11 and C21 are decreased with the first and second slew rates SR1 and SR2 while being compared with the reference voltage Vref, to accordingly generate the first and second digital output signals OUT1 and OUT2, it is to be noted that the present invention is not limited to such. For example, as opposed to the above description, it can be envisaged that, after the voltages of the first and second charging capacitors C11 and C21 are discharged to the ground voltage (VSS) in an initial state, voltages are charged to the first and second charging capacitors C11 and C21 while being compared with the reference voltage Vref, to accordingly generate the first and second digital output signals OUT1 and OUT2.

As is apparent from the above description, according to the embodiment of the present invention, advantages are provided in that the time gain of a time difference amplifier is determined by a ratio between the slew rates of output voltages changed according to a phase combination of digital input signals, thereby allowing the slew rates of the output voltages to be regulated from an outside, so that the time gain may be conveniently controlled in conformity with various purposes and applications after the time difference amplifier is fabricated.

Also, advantages are provided in that, as the time difference amplifier is designed to have an open loop structure, when compared to the conventional time difference amplifier, it is possible to obtain a time gain with a constant value for a wide input time period.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A time difference amplifier using slew rate control, comprising:
a first digital signal output unit including a first slew rate setting section configured to set a first slew rate for a voltage charged to a level of a power supply voltage in a first charging capacitor and generate a first output voltage which is decreased with the first slew rate when a first digital input signal inputted to a first input terminal transitions and to change the first slew rate to a second slew rate and generate the first output voltage which is decreased with the second slew rate when a second digital input signal inputted to a second input terminal transitions so that phases of the first digital input signal and the second digital input signal become different from initial phases, and a first voltage comparator configured to compare the first output voltage outputted from the first slew rate setting section with a reference voltage and accordingly output a first digital signal; and
a second digital signal output unit including a second slew rate setting section configured to output a voltage of the level of the power supply voltage charged in a second charging capacitor as a second output voltage when the second digital input signal inputted to a third input terminal does not transition and to set the second slew rate for the voltage charged to the level of the power supply voltage and generate the second output voltage which is decreased with the second slew rate when the second digital input signal inputted to the third input terminal transitions so that the phases of the first digital input signal and the second digital input signal become different from the initial phases, and a second voltage comparator configured to compare the second output voltage outputted from the second slew rate setting section with the reference voltage and accordingly output a second digital signal.

2. The time difference amplifier according to claim 1, wherein the first slew rate setting section comprises:
a first charging switch and a first charging capacitor connected in series between a power supply terminal and a ground terminal; and
a pair of a first discharging switch and a first current source and a pair of a second discharging switch and a second current source each pair of which is connected in series between a first node as a common connection point of the first charging switch and the first charging capacitor connected in series and the ground terminal, the first node being connected to an inverting input terminal of the first voltage comparator.

3. The time difference amplifier according to claim 2, wherein the first current source and the second current source can be controlled from an outside of a time difference amplifier.

4. The time difference amplifier according to claim 1, wherein the first output voltage which starts to be decreased with the second slew rate by changing the first slew rate to the second slew rate is higher than the reference voltage.

5. The time difference amplifier according to claim 1, wherein the second slew rate setting section comprises:
   a second charging switch and a second charging capacitor connected in series between the power supply terminal and the ground terminal; and
   a pair of a third discharging switch and a third current source and a pair of a fourth discharging switch and a fourth current source each pair of which is connected in series between a second node as a common connection point of the second charging switch and the second charging capacitor and the ground terminal, the second node being connected to an inverting input terminal of the second voltage comparator.

6. The time difference amplifier according to claim 1, wherein a time gain of the time difference amplifier is determined by dividing the first slew rate by the second slew rate.

7. The time difference amplifier according to claim 1, wherein the first output voltage and the second output voltage are determined only by the first digital input signal and the second digital input signal and are regardless of a feedback voltage.

8. The time difference amplifier according to claim 1, wherein the first slew rate is determined as a value obtained by dividing a value of the first current source by a capacitance value of the first charging capacitor.

9. The time difference amplifier according to claim 1, wherein the second slew rate is determined as a value obtained by dividing a value of the second current source by a capacitance value of the second charging capacitor.

10. A time difference amplifier using slew rate control, comprising:
    a first digital signal output unit including a first slew rate setting section configured to set a first slew rate for a voltage discharged to a level of a ground voltage in a first charging capacitor and generate a first output voltage which is increased with the first slew rate when a first digital input signal inputted to a first input terminal transitions and to change the first slew rate to a second slew rate and generate the first output voltage which is increased with the second slew rate when a second digital input signal inputted to a second input terminal transitions so that phases of the first digital input signal and the second digital input signal become different from initial phases, and a first voltage comparator configured to compare the first output voltage outputted from the first slew rate setting section with a reference voltage and accordingly output a first digital signal; and
    a second digital signal output unit including a second slew rate setting section configured to output a voltage of the level of the ground voltage discharged in a second charging capacitor as a second output voltage when the second digital input signal inputted to a third input terminal does not transition and to set the second slew rate for the voltage discharged to the level of the ground voltage and generate the second output voltage which is increased with the second slew rate when the second digital input signal inputted to the third input terminal transitions so that the phases of the first digital input signal and the second digital input signal become different from the initial phases, and a second voltage comparator configured to compare the second output voltage outputted from the second slew rate setting section with the reference voltage and accordingly output a second digital signal.

11. A time difference amplification method using slew rate control, comprising:
    (a) setting a first slew rate for a voltage charged to a level of a power supply voltage in a first charging capacitor and generating a first output voltage which is changed with the first slew rate when a first digital input signal inputted to a first input terminal of a first slew rate setting section transitions, and changing the first slew rate to a second slew rate and generating the first output voltage which is changed with the second slew rate when a second digital input signal inputted to a second input terminal of the first slew rate setting section transitions so that phases of the first digital input signal and the second digital input signal become different from initial phases;
    (b) comparing the first output voltage with a reference voltage and outputting a first digital signal by a first voltage comparator;
    (c) outputting a voltage of the level of the power supply voltage charged or a ground voltage discharged in a second charging capacitor as a second output voltage when the second digital input signal inputted to a third input terminal of a second slew rate setting section does not transition, and setting the second slew rate for the voltage charged to the level of the power supply voltage or discharged to the level of the ground voltage and generating the second output voltage which is decreased with the second slew rate when the second digital input signal inputted to the third input terminal of the second slew rate setting section transitions so that the phases of the first digital input signal and the second digital input signal become different from the initial phases; and
    (d) comparing the second output voltage outputted from the second slew rate setting section with the reference voltage and outputting a second digital signal by a second voltage comparator.

* * * * *